United States Patent [19]

Terasima

[11] Patent Number: 4,866,401
[45] Date of Patent: Sep. 12, 1989

[54] HIGH CURRENT DARLINGTON AMPLIFIER

[75] Inventor: Zirou Terasima, Matsumoto, Japan

[73] Assignee: Fuji Electric Co., Ltd., Japan

[21] Appl. No.: 277,876

[22] Filed: Nov. 30, 1988

[30] Foreign Application Priority Data

Dec. 8, 1987 [JP] Japan .................................. 62-310505

[51] Int. Cl.⁴ ........................... H03F 1/52; H03F 3/50
[52] U.S. Cl. .................................... 330/310; 307/300; 307/315; 330/298; 330/307
[58] Field of Search .................. 330/207 P, 298, 307, 330/310; 307/300, 315; 357/46; 361/77, 84, 87, 98

[56] References Cited

FOREIGN PATENT DOCUMENTS 126321 7/1984 Japan .................................. 307/315

Primary Examiner—James B. Mullins
Attorney, Agent, or Firm—Brumbaugh, Graves, Donohue & Raymond

[57] ABSTRACT

The invention teaches the placement of a plurality of conducting paths in the vicinity of the base of the final stage of a Darlington configured transistor group. When an abrupt change in carrier density occurs, such as during switching intervals, the added conduction paths facilitate the removal of carriers from the base region, thereby facilitating the turn-off process. The extra conductive paths allow a more even current density within the volume of the base during changes in carrier density.

1 Claim, 2 Drawing Sheets

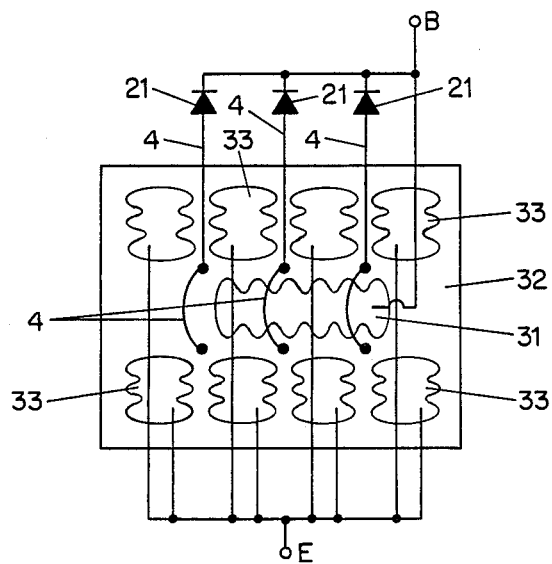
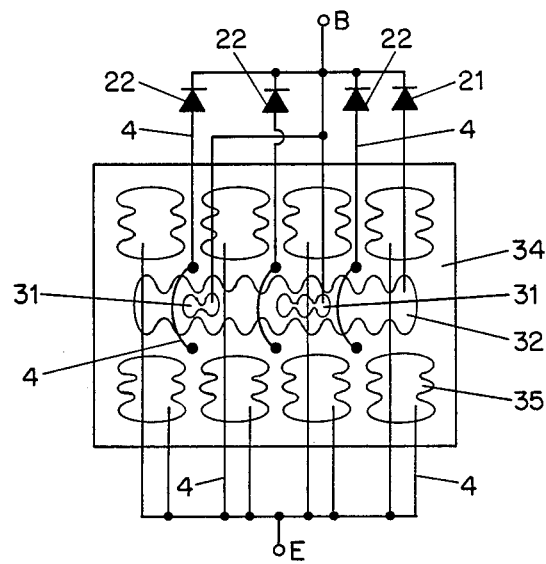
FIG.1(a)　　　　　　　FIG.1(b)
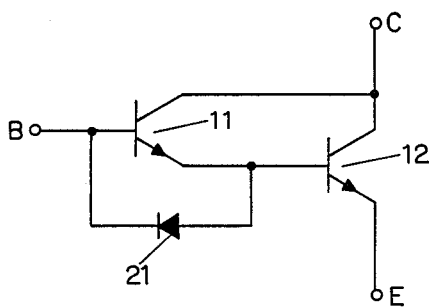
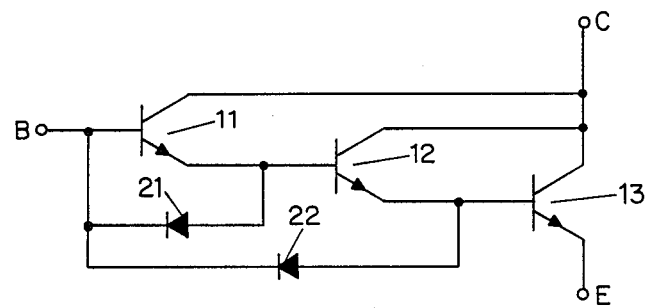
FIG.2(a)　　　　　　　FIG.2(b)
(PRIOR ART)　　　　　(PRIOR ART)
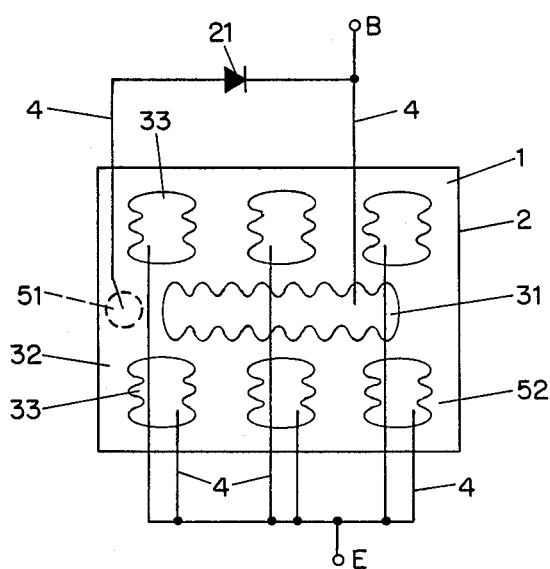
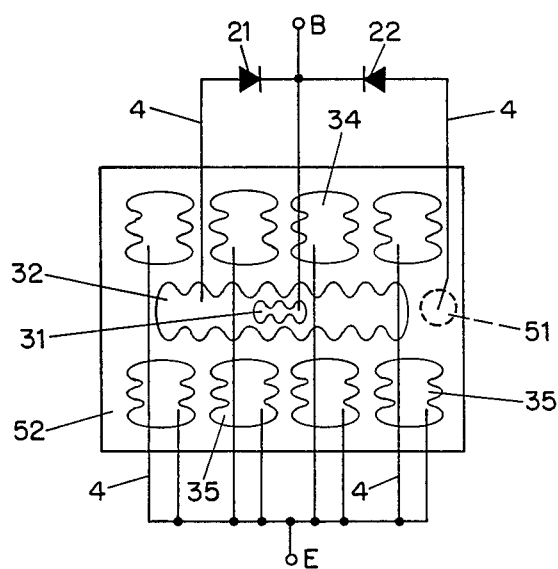
FIG.3(a)　　　　　　　FIG.3(b)
(PRIOR ART)　　　　　(PRIOR ART)

HIGH CURRENT DARLINGTON AMPLIFIER

This invention is also described in Application No. 62-310505 dated Dec. 8, 1987, filed in the Patent Office of the Japanese Government.

BACKGROUND OF THE INVENTION

1. Field of the Invention

This invention relates to an improvement in the internal wiring of semiconductors in a Darlington amplifier configuration and more particularly, to a Darlington amplifier configuration in which speed-up diodes are connected between the base of the front-stage transistor(s) and the base of the rear-stage transistor(s) to allow for better current distribution in the base region of the rear-stage transistor(s) during periods of abrupt changes in device current density.

2. Description of the Related Art

To make a large capacity transistor, a plurality of individual transistors are connected to form a Darlington configuration. This configuration typically consists of rear stage transistor(s) and front stage transistor(s). One advantage of the Darlington configuration is that the gain of the combination of the two stages is the product of the gain of each of the multiple transistors comprised within the stages. Furthermore, each of the transistors within the stages can be optimized for power handling capability, gain, frequency response and/or other parameters of interest.

In typical prior art examples, in a multiple transistor configuration, the base of the rear-stage transistor of the Darlington circuit is connected with the base of the front-stage transistor via a speed-up diode to shorten the turn-off time. Equivalent circuits of such Darlington configurations are shown in FIGS. 2(a) and 2(b).

A Darlington amplifier consisting of two transistors is shown in FIG. 2(a). Here a speed-up diode 21 has its cathode connected to the base of NPN transistor 11. This diode 21 is connected in a forward direction between the base of the rear-stage, or output stage, NPN transistor 12 and the base of the front-stage, or input stage, NPN transistor 11.

A Darlington amplifier comprising three transistors is shown in FIG. 2(b), where a first speed-up diode 21 is connected in a forward direction between the base of the second-stage NPN transistor 12 and the base of the first-stage NPN transistor 11. A second speed-up diode 22 is connected in a forward direction between the base of the final-stage, or output-stage, NPN transistor 13 and the base of the front-stage transistor 11.

FIGS. 3(a) and 3(b) show chip level electrical interconnections of the Darlington configurations which are shown schematically in FIG. 2. The interconnections shown in FIG. 3 are bonded to the semiconductor material constituting the Darlington structure.

Referring to FIG. 3(a), in the Darlington amplifier configuration comprising the two transistors, a base terminal B is connected to the base 32 of the rear-stage transistor via speed-up diode 21 and aluminum leads 4. Base 32 also acts as the emitter of the front-stage transistor and is connected to base 31 of the front-stage transistor and the speed-up diode 21 by aluminum leads 4. Bases 31 and 32 are both positioned on semiconductor chip 1. An emitter terminal E is connected to the plural emitters 33 of the rear-stage transistor by aluminum leads 4.

Referring to FIG. 3(b), in the Darlington amplifier comprising three transistors, a base terminal B is connected to the base 32 of the second-stage transistor serving also as the emitter of the front-stage transistor, via the base 31 of the front-stage transistor and the speed-up diode 21 with aluminum leads 4. Also, the base terminal B is connected to the base 34 of the final-stage transistor via the speed-up diode 22 and aluminum lead 4, acting also as the emitter of the second-stage transistor. An emitter terminal E is connected to the plural emitters 35 of the final-stage, or output stage, transistor by aluminum leads 4.

In the prior art circuit configurations, when a reverse bias is applied between the base and the emitter of each Darlington amplifier to turn it off, carriers are not drained uniformly from the vicinities of a bonding pad 51 for the base 32 of the rear-stage transistor shown in FIG. 3(a) and from a portion away from the pad, for example the portion 52. This portion 52, in which carriers concentrate, may not be rapidly turned off but rather keeps conducting, forcing a transitional high carrier current density in the portion 52 of the device during transition periods in operating states. The high current density associated with the on to off transition creates heat, which in turn may destroy the device.

A similar situation occurs between a bonding pad 51 for the base 33 of the final-stage, or output stage, transistor of the three-stage Darlington amplifier shown in FIG. 3(b), and a relatively remote portion 52 opposite pad 51.

It is an object of the invention to provide a Darlington amplifier in which electric current flowing through the base of the output-stage, or final-stage, transistor is less likely to be distributed non-uniformly during transition (turn off) times. It is desired to optimize the current distribution in the semiconductor material of the Darlington configuration so that when the amplifier is turned off, undesirable excess current concentration is reduced in portions where carriers linger, and turn-off conditions are not reached quickly. The goal is to remove carriers uniformly from the base of the output-stage transistor and thereby extend the safe operating region during the application of a reverse bias on said Darlington configuration.

SUMMARY OF THE INVENTION

The above object is achieved in accordance with the teachings of this invention by a Darlington amplifier comprising a plurality of transistors, where the base of the rear-stage transistor is connected to the base of the front-stage transistor via speed-up diodes. The Darlington amplifier according to the present invention is characterized in that the speed-up diodes are connected by leads to the base of the final-stage transistor at plural locations spaced from each other on the base region.

Since the base of the output-stage transistor is connected via the speed-up diodes to the front-stage transistor by the leads at plural locations distributed over the base, carriers are uniformly taken from the base region of the output-stage transistor when the amplifier is turned off. Consequently, high current concentrations during turn-off or other state transitions where the current density in the device changes abruptly, are less likely to occur.

BRIEF DESCRIPTION OF THE DRAWINGS

FIG. 1(a) is a plan view of a Darlington amplifier comprising two transistors and built in accordance with the invention;

FIG. 1(b) is a plan view of a Darlington amplifier comprising three transistors and built in accordance with the invention;

FIGS. 2(a) and 2(b), to which reference has already been made are equivalent circuit diagrams of known two-and three transistor Darlington amplifiers and also of the Darlington amplifiers shown in FIGS. 1(a) and (b), respectively;

FIGS. 3(a) and 3(b), to which reference has been made, are plan views of conventional Darlington amplifiers comprising two transistors and three transistors, respectively.

DESCRIPTION OF THE PREFERRED EMBODIMENTS

Figure 4:
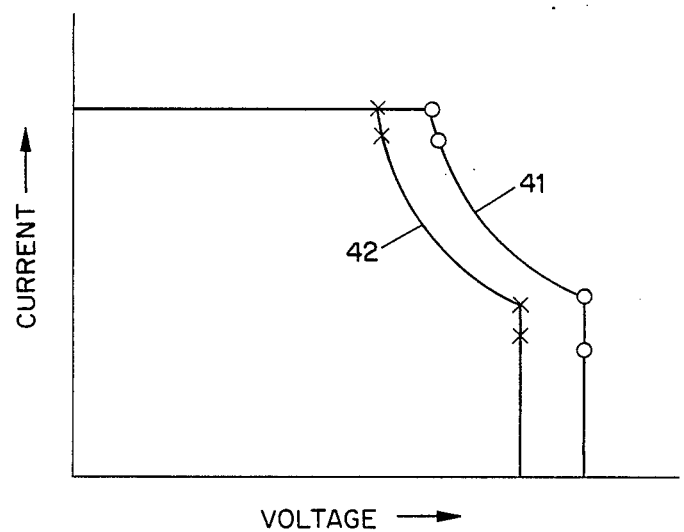
FIG. 4 is a graph showing safe operating regions of the novel Darlington amplifier and a conventional Darlington amplifier, when a reverse bias is applied.

Darlington amplifiers constructed in accordance with the invention are shown in FIGS. 1(a) and 1(b). These amplifiers comprise two transistors and three transistors, respectively. It is to be noted that like components are denoted by like reference numerals in FIGS. 1, 2, 3.

The Darlington amplifier shown in FIG. 1(a) comprises two transistors. The base 32 of the rear-stage transistor acts also as the emitter of the front-stage transistor. Six portions of the base 32 are connected to the base terminal B via three speed-up diodes 21 by aluminum leads 4.

Similarly, in the Darlington amplifier shown in FIG. 1(b) and consisting of three transistors, the base electrode 34 serves also as the emitter of the second-stage transistors, and six portions of the base 34 are connected to the base terminal B via three speed-up diodes 22 by aluminum leads 4. The base 32 of the second-stage transistor is connected at one location to the base terminal B via a speed-up diode 21. The front-stage transistors have two bases 31 which act also as emitters of the second-stage transistor. These two bases 31 are connected to the base terminal B.

The leads 4, which are remotely located from the speed-up diodes connected to the bases 32, 34 of the transistors, form extensions to the leads 4 close to the diodes to reduce the number of leads and to avoid short-circuit between the leads.

In FIG. 4, the curve 41 shows the safe operating region of the novel Darlington amplifier depicted in FIG. 1(a) when a reverse bias is applied. The safe operating region of a conventional Darlington amplifier shown in FIG. 3(a) when a reverse bias is applied is indicated by the curve 42 in FIG. 4. It can be seen from this graph that the invention provides an extended safe operating region for the Darlington amplifier.

In accordance with the invention, the base of the output-stage transistor of a Darlington amplifier is connected by leads to the base of the front-stage transistor via speed-up diodes spaced from each other on the base of the output-stage transistor. Thus, carriers are taken uniformly from the base of the output-stage transistor. As a result, destruction which would have been heretofore caused by uneven current distribution within the semiconductor material is prevented. Hence, the safe operating region applicable during reverse bias condition is extended.

While the invention has been described with reference to preferred embodiments, it will be understood by those skilled in the art that various changes in form and detail may be made without departing from the spirit and scope of the invention as defined in the following claims.

I claim:

1. In a Darlington amplifier comprising a plurality of transistors wherein the base of the rear-stage transistor is connected to the base of the front-stage transistor via speed-up diodes, characterized in that the speed-up diodes are connected by a plurality of leads to the base region of the final-stage transistor at plural locations spaced from each other on the base for uniformly removing carriers from the base of the rear-stage transistor to thereby extend the safe operating region of the amplifier during application of reverse bias.

* * * * *